(12) United States Patent
Daoud et al.

(10) Patent No.: US 6,879,918 B2
(45) Date of Patent: Apr. 12, 2005

(54) METHOD AND APPARATUS FOR MEASURING THE TRANSMISSION LOSS OF A CABLE

(75) Inventors: Bassel H. Daoud, Parsippany, NJ (US); Christopher E. Gayle, San Jose, CA (US); Ivan Pawlenko, Holland, PA (US); Dieter N. Scherer, Palo Alto, CA (US); Richard F. Schwartz, Cranbury, NJ (US); Michael J. Wheeler, Haverhill, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/448,853

(22) Filed: May 30, 2003

(65) Prior Publication Data

US 2004/0243326 A1 Dec. 2, 2004

(51) Int. Cl.[7] .............................................. G01R 27/00
(52) U.S. Cl. ....................................................... 702/65
(58) Field of Search ........................................... 702/65

(56) References Cited

U.S. PATENT DOCUMENTS

| | | | | |
|---|---|---|---|---|
| 5,140,336 A | * | 8/1992 | Suomi .......................... 343/790 |
| 5,311,440 A | * | 5/1994 | Hess, Jr. ....................... 324/615 |
| 5,315,258 A | * | 5/1994 | Jakkula et al. ............... 324/640 |
| 5,471,146 A | * | 11/1995 | Krayeski et al. ............. 324/637 |
| 5,499,031 A | * | 3/1996 | Bodonyi ....................... 342/174 |
| 5,896,113 A | * | 4/1999 | O'Neill, Jr. .................. 343/895 |
| 6,067,449 A | * | 5/2000 | Jager ........................... 455/277.2 |
| 6,137,996 A | * | 10/2000 | Baumann ....................... 455/82 |
| 6,317,081 B1 | * | 11/2001 | Stilp ............................ 342/387 |
| 6,392,610 B1 | * | 5/2002 | Braun et al. ................. 343/876 |
| 6,437,577 B1 | * | 8/2002 | Fritzmann et al. ........... 324/523 |
| 6,542,046 B2 | * | 4/2003 | Kitamori et al. ............. 333/113 |
| 6,594,508 B1 | * | 7/2003 | Ketonen ....................... 455/561 |
| 6,600,307 B2 | * | 7/2003 | Turski et al. .................. 324/95 |
| 6,690,922 B1 | * | 2/2004 | Lindemann ................... 455/69 |
| 6,747,956 B1 | * | 6/2004 | Darack et al. ............... 370/252 |
| 2001/0012770 A1 | * | 8/2001 | van der Pol ............. 455/232.1 |
| 2001/0039198 A1 | * | 11/2001 | Onishi et al. ............... 455/562 |
| 2002/0053953 A1 | * | 5/2002 | Edmonson et al. ........ 333/17.3 |
| 2002/0060615 A1 | * | 5/2002 | Kodim ......................... 333/101 |
| 2003/0148762 A1 | * | 8/2003 | Noe ............................ 455/423 |
| 2003/0156060 A1 | * | 8/2003 | Revankar et al. ........... 342/372 |
| 2004/0121742 A1 | * | 6/2004 | Abrams et al. ........... 455/115.1 |

* cited by examiner

Primary Examiner—Marc S. Hoff
Assistant Examiner—Anthony Gutierrez (57) ABSTRACT

The invention is directed to techniques and mechanisms for measuring transmission loss of a cable comprising the steps of disabling an antenna connected to a second end of the cable, feeding an input signal having an energy level into a first end of the cable for transmission of the input energy toward the second end of the cable, measuring a reflected energy, reflected back toward the first end of the cable from the second end of the cable, and comparing the reflected energy to a input energy to determine a cable loss. Directional couplers may be used to sample the input and reflected energy to be measured. The information derived from the comparison of input and reflected energy measurements can then be used to calibrate a transmitter thereby optimizing performance.

16 Claims, 6 Drawing Sheets

METHOD AND APPARATUS FOR MEASURING THE TRANSMISSION LOSS OF A CABLE

BACKGROUND OF THE INVENTION

Fixed wireless systems are finding use as an alternative to wired phone systems in many areas of the world. These systems use a permanently installed two-way radio located on the customer's property to communicate with a base station, which is connected to a landline telecommunication network, such as the U.S. Public Switched Telephone Network (PSTN). Such systems have helped to reduce the expense involved in providing communications when existing facilities are limited or the terrain is remote or inaccessible. The use of such wireless systems makes access to telephone networks possible in areas that would not otherwise have such access.

The radio system used by the customer is typically comprised of a phone interface, a power supply, a radio unit, an antenna, and a cable interconnecting the radio unit to the antenna. In such a system, the radio unit is connected by cable to an antenna, such as at a centrally located antenna site or other remote antenna. From there, radio frequency transmissions are broadcast to another antenna connected to the base station and thence to the telecommunications network. In the installation of the customer-premise radio unit, measurement of the performance of the cable (e.g. transmission loss of the cable) interconnecting the radio unit to the antenna is necessary. Such performance information is used, in turn, to calibrate the radio unit, in order to ensure appropriate performance of the radio unit, cable and antenna combination. Measurement of the cable performance (e.g. transmission loss) requires personnel with training and skill to conduct the measurements, consumes technician time, and requires test equipment that has to be transported to the installation site. Furthermore, it is preferable that the measurement be made after the cable is installed, for best accuracy, but the two ends of the cable are then often far apart, and accessibility is much more difficult.

In addition to the required cable performance measurements during installation of the radio system, conventional methods require later measurements, as well, due to changes in cable performance, such as those related to changes in environment, weather, age of facilities, etc. that necessitate re-testing of a cable, as well as re-calibration of the radio unit. The need for additional testing may be complicated in such cases as where customer-based radio units are installed at remote or access-limited locations. Any delay in testing which may result can translate into sub-optimal performance of the radio and antenna combination and may result in poor transmission quality. As a result, radio and antenna installations that experience changes in cable parameters may perform poorly until a technician with the proper training and equipment is able to re-test and re-calibrate the cable and transmitter.

SUMMARY OF THE INVENTION

Embodiments of the invention are directed to enhanced methods and mechanisms for conducting cable performance measurements, particularly cable transmission loss. According to the method of the invention, a signal generator transmits direct energy over an RF cable connecting the radio unit and the antenna, with the far end of the cable having been placed in an open circuit or short circuit state. The energy reflected back from the far end of the cable is measured and compared to the generated energy. The comparison of the direct and reflected energy provides the basis for a determination of the cable transmission loss.

In one embodiment of the invention, a first directional coupler generates a sample of the direct energy that was fed into the near end of the cable and a detector captures and measures a sample of the direct energy. When the reflected energy (from the far end of the cable) travels back to the near end of the cable, a second directional coupler (e.g. configured to operate in the opposite direction of signal flow) samples the reflected energy. Then a second detector captures and measures a sample of the reflected energy, from which the magnitude of the reflected energy can be determined. By comparing the magnitude of the direct energy to the magnitude of the reflected energy, it is possible to calculate the transmission loss over the length of the cable. In this way, it is possible to determine the transmission loss of the cable from a location at one end of the cable without manning the other end of the cable. That transmission loss is then used as a metric for tuning the cable for optimal operation with the radio and antenna combination.

The invention also enables continuous optimization of the radio and antenna system because of the simplicity of conducting regular performance monitoring. Embodiments of the invention can also be employed to serve as a cable detector, detecting cable problems such as breaks, bad connections, etc. during or after installation.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to a method for determining a loss parameter for a transmission line connecting an RF signal source and an antenna after the transmission line is in an installed location, and to tune the overall RF system for optimum performance based on that loss parameter. Accordingly, with the method of the invention, knowledge of the length, electrical characteristics, or the number of splices, bends, connectors, or adapters in the installed transmission line is unnecessary. The invention operates to automatically measure the loss parameter, without requiring technical training or skill on the part of the installer. In addition, access to the far end of the cable is not required.

The measurement and optimization may be repeated after the installation is complete, to account for changes in transmission line parameters, such as may be caused by aging, weather, etc.

The invention adapts a known transmission line characteristic to the determination of the loss parameter for a transmission line installed between an RF signal source and an antenna. As is well known, when an end of a transmission line is either open or short circuited, substantially all of the RF energy in a signal reaching that open or short circuit from an RF signal source (located at another point on the transmission line) is reflected back along the transmission line toward the signal source. Using that principle, the method of the invention operates to cause the end of the installed transmission line connected to the antenna (hereafter usually referred to as the "far end") to be placed into an open or short-circuited state. An RF signal substantially comparable to a working signal for the radio/antenna system is then injected at the RF input end (hereafter usually referred to as the "near end") of the transmission line. Then by arranging to capture the magnitude of the reflected signal at approximately the point where it reaches the near end of the transmission line and compare it with the magnitude of the injected signal, the invention makes a determination of the loss parameter for the transmission line. That loss parameter is then processed to determine any needed tuning of the RF signal path in order to substantially optimize the energy transfer between the RF signal source and the antenna.

It is to be noted that the transmission line for an RF system in which the method of the invention is applied will typically be implemented as a coaxial cable. Accordingly, for convenience of reference, that transmission line will generally be referred to as the "RF cable" or as the "antenna cable." Similarly, the RF signal source will generally be referred to hereafter as the "transmitter" or the "radio." It should, however, be understood that the scope of the invention extends to any RF transmission system in which an RF signal source is sending its input signal to an antenna via a transmission line.

Figure 1:
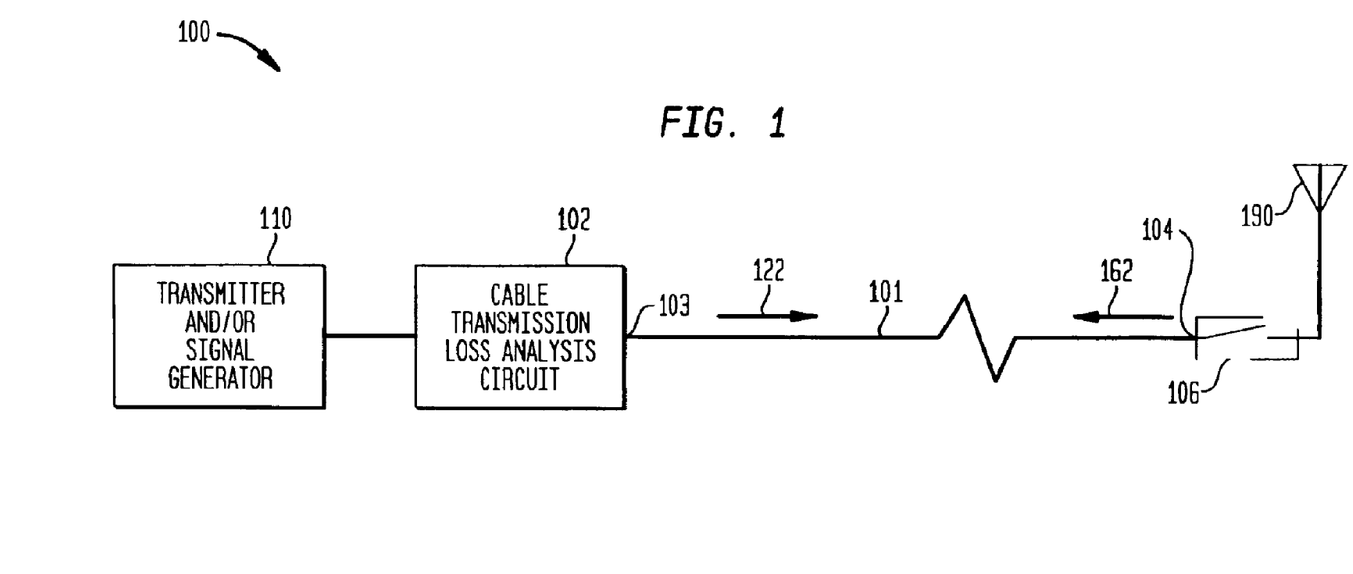
FIG. 1 provides an overall schematic depiction of a communications environment adapted to implement the method of the invention.

FIG. 1 provides an overall schematic depiction of an apparatus suitable for measuring transmission loss of a cable according to the method of the invention. As shown in the figure, a Transmitter/Signal Generator 110 is connected as an input device at the near end of RF cable 101, the cable having a connection to Antenna 190 at its far end 104 via switching means 106, which is operable to selectively open the connection between the antenna and the cable and/or short circuit that cable end. The direct and reflected signals on cable 101 are schematically depicted by arrows 122 and 162 respectively. A Cable Transmission Loss Analysis Circuit 102 is disposed at a point 103 proximate to the near end of the cable, and operates to capture the magnitudes of the direct signal transmitted from Transmitter 110 and the reflected signal from the open or shorted far end of the cable, and to determine a cable loss parameter based on the relative magnitude of those two signals.

Specifically, the Cable Loss Analysis Circuitry 102 compares the reflected RF signal energy 162 to the direct RF signal energy 122 and calculates the transmission loss of the cable 101. In turn, the cable transmission loss information is used to calibrate the transmitter 110 in such a way as to optimize the operation of the transmitter 110, cable 101 and antenna 190 combination.

Note that, in general, the radio circuitry will contain a database of parameters relating to the radio itself, including such things as output power under various conditions, antenna gain, and loss from radio to antenna (cable loss), all of which may be frequency dependent. The system of the invention will program or set those elements of the database relating to loss on the interconnection from radio unit to antenna that are dependent on the particular installation—determined by such things as cable size, length, connectors, and installation quality. The cable loss figure will then be used by the radio circuitry to optimize transmitted power and receiver gain, acting to improve performance of the entire system by reducing interference among radio units. The radio also will typically send the same data to the base station, again for the purpose of improving system performance.

Figure 2:
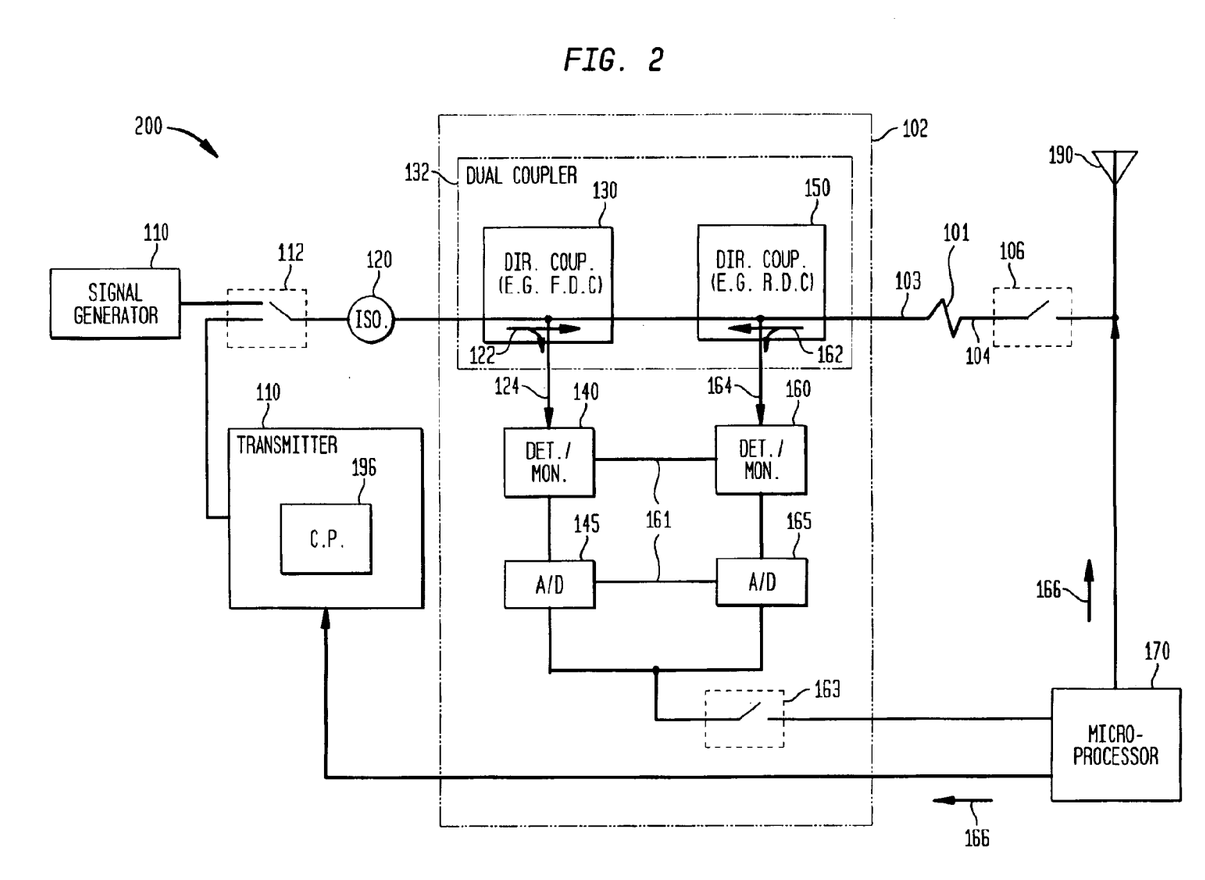
FIG. 2 provides a detailed schematic depiction of a particular embodiment of the invention.

An exemplary embodiment of the invention is depicted in FIG. 2. As will be apparent from the figure, the representation of the cable 101 is compressed in order to provide space for a more detailed depiction of the structure of this embodiment.

With reference to FIG. 2, a signal is input to Cable 101 from signal source 110, representing the direct energy to be transmitted along the cable. Signal source 110 may be implemented as either a stand-alone Signal Generator 110 or as an RF signal from the Transmitter 110 of the transmission system. In the case of a stand-alone Signal Generator being used, a switching means 112 is provided for disconnecting the system transmitter and connecting the signal generator to the cable when cable performance tests are being conducted.

The separate Signal Generator may be a hand-held device capable of being carried from one location to another or a device dedicated to a particular remote communications system and permanently installed at the location of such system. In the latter case, the Signal Generator may be configured to form an integral part of the system transmitter circuitry.

The operating frequency of signal source 110 may be in a narrow band that is a few megahertz wide, and spectrally located somewhere within the range of a few hundred megahertz to several thousand megahertz. The direct energy can be small—e.g 1 mw to 100 mw is adequate.

An Isolator 120, which permits the unidirectional flow of RF energy from input to output, but not the reverse, may be located in Cable 101 downstream from signal source 110. The Isolator 120 protects the signal generator/transmitter 110 from damage or interference caused from unwanted radio frequency energy or other transmissions, including reflected energy on the cable.

With further reference to FIG. 2, a Directional Coupler 130 is coupled to Cable 101 in a manner to sample the direct energy 122 inputted to the cable from signal source 110, and a Detector/Monitor 140 is connected to Directional Coupler 130 to detect and measure the sampled direct energy 124. In like manner, Directional Coupler 150 is coupled to Cable 101 in a manner to sample the energy 162 reflected from the far end of Cable 101 (upon that cable far-end having been placed in an open or short circuited state). Detector/Monitor 160 is connected to Directional Coupler 150 to detect and measure the sampled reflected energy 164. As indicated by the dashed lines around Directional Couplers 130 and 150, the functions of those directional couplers may be combined into a dual coupler 132. [Note that Detector/Monitor 140, 160 may be implemented as a detector and/or a monitor, such as a power monitor, etc.; the function thereof may be performed by the detector operating in conjunction with other components such as an analog-to-digital converters 145, 165, a microprocessor 170, and/or other devices].

Cable 101 may be manually disconnected at its far end from antenna 190 in order to place the cable far-end into an open or short-circuited state. Alternatively, a remotely operable switching means 106 may be implemented at the cable far-end, so that an operator may effect such a disconnection (and placement into an open or short-circuited state) without having physical access to the cable/antenna connection. Such a remotely operable switching means may be provided by any known switching device, including a relay or a PIN diode.

Information about the direct and reflected energy 122, 162 as obtained at a detector is 140 and 160 may then be communicated via a transmission path 161 that connects both of the detectors 140, 160. In alternative embodiments of the invention, communications between the detectors 140, 160 may occur over connections through other devices such as the analog-to-digital converters 145, 165 or other components configured to transmit such information. Illustratively, the sample of the direct energy 124 and the sample of the reflected energy 164 may be transmitted to analog-to-digital converters 145, 165 so that the signals may be processed and compared—for example, in a microprocessor 170 connected to the analog-to-digital converters 145, 165. Microprocessor 170 may be implemented as a dedicated device or as a shared function in a microprocessor associated with the transmission system. In the latter case, a switching means 163 will also be provided to switch the microprocessor between system functions and cable-performance functions.

Transmission loss information is transmitted via a communications link 166 to the system transmitter 110 as one or more calibration parameters 196, and the transmitter may be calibrating based on such parameters. Such transmission loss information may also be provided to other devices, such as devices connected to the cable 101 and/or to the antenna 190, or may be provided to the cable and/or antenna, for calibration purposes.

Figure 4:
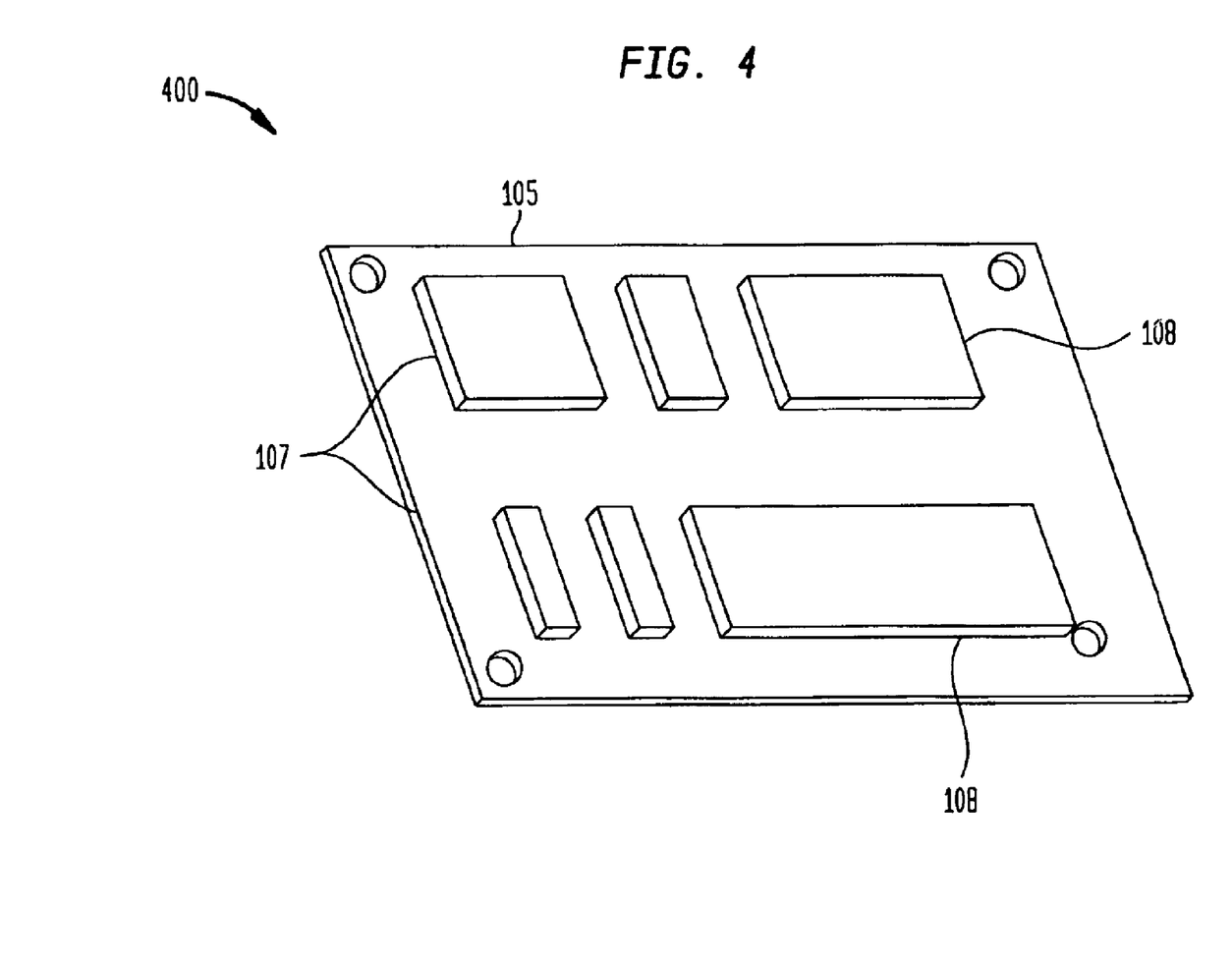
FIG. 4 provides a pictorial illustration of RF analysis circuitry implemented according to the invention and integrated with transmitter circuitry on a single circuit board.

In a further embodiment of the invention, the signal source 110, the isolator 120 (if used) and the components shown within dashed line 102 of FIG. 2 may be integrated together on a single circuit board 105, as depicted, by way of example, in FIG. 4. Directional couplers 130, 150 may be made from circuit board materials or such components as coils of wire and resistors. Such directional couplers 130, 150 may consist of a pair of circuit traces of the proper dimensions, with an associated resistor. For low frequencies, a directional coupler 130, 150 may be made by winding a few turns of fine wire around a form made from a magnetic material. Such integration of transmitter 110 and analytic devices 102 can be expected to simplify and reduce circuit design and production costs. Note that, for this embodiment, a "calibration" step will be required during manufacture of the integrated components in order to compensate for the variation from unit to unit of directional couplers, detectors, etc. These types of operations are already done during manufacture for other parts of the radio and the described calibration step can readily be combined with such normal manufacturing operations.

Figure 3:
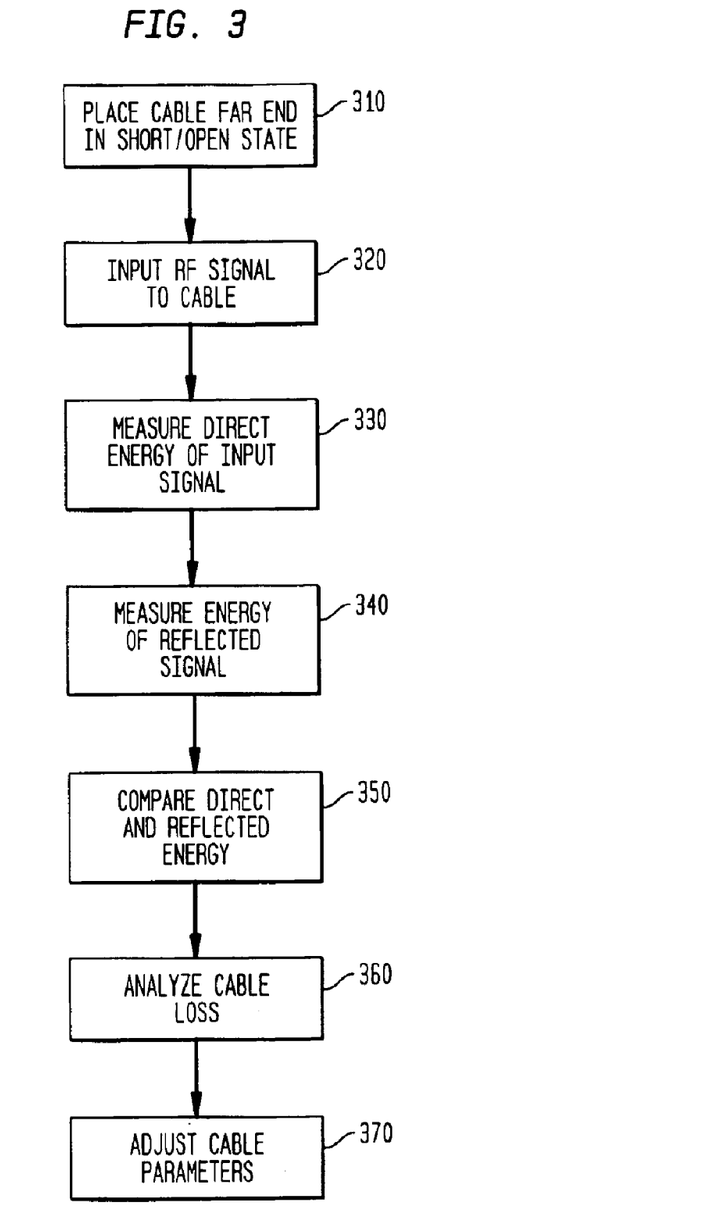
FIG. 3 is a flow chart of showing steps carried out in the method of the invention.

A flowchart directed to the method of the invention is shown in FIG. 3. With reference to that flowchart, the process begins at step 310 with disconnection of the antenna from the cable at its far end, thereby placing the far end of the cable in an open-circuit state. Alternatively, the far end of the cable may be placed in a short-circuited state after disconnection from the antenna. The shorted or open-circuited cable end will thereby operate to reflect substantially all of the energy of a signal transiting the cable from its near end. As indicated previously, this step of placing the far end of the cable into an open or short-circuited state may be carried out remotely from the antenna site by means of a remotely operated switching means.

Following the placement of the cable far-end into an open or short-circuited state, an RF signal is fed to the near end of the cable, at step 320, that RF signal being substantially comparable to a working signal for the radio/antenna system. At step 330, a measure of the direct energy of the inputted RF signal is obtained, illustratively by use of a directional coupler arranged to receive the input signal and provide a sample thereof for measurement—the remaining portion of the input signal passing through the coupler with a negligible change in its energy level. Alternately, the magnitude of the input energy level may be predetermined and this measurement step accordingly eliminated.

As described above, the inputted direct signal energy will be substantially reflected at the open or short-circuited far end of the cable. The energy of that reflected signal is measured at step 340, illustratively by use of a directional coupler arranged to receive the reflected signal and provide a sample thereof for measurement. As will be understood by those skilled in the art, both the direct and reflected energy on the cable could also be measured directly, by various known measurement devices. However, by sampling the signal, as by use of a coupler, the magnitude of the signal to be measured is reduced (by the coupler scale factor) which may be advantageous in terms of the instrumentation for the measurements. For example, the sampled output of such a coupler may be of the order of 1 to 10 percent of the magnitude of the signal energy passing through the coupler, and detection/measurement of such a sampled signal by be carried out by radio frequency diodes.

Once measurements of both the direct and reflected energy on the cable under test have been determined, a comparison is made of those measurements at step 350, with the cable loss derived therefrom being determined and analyzed at step 360. Appropriate adjustments to the RF system are derived from the cable loss information, and those adjustments are made at step 370 to substantially optimize the performance of the overall transmission system, cable and antenna.

Figure 5:
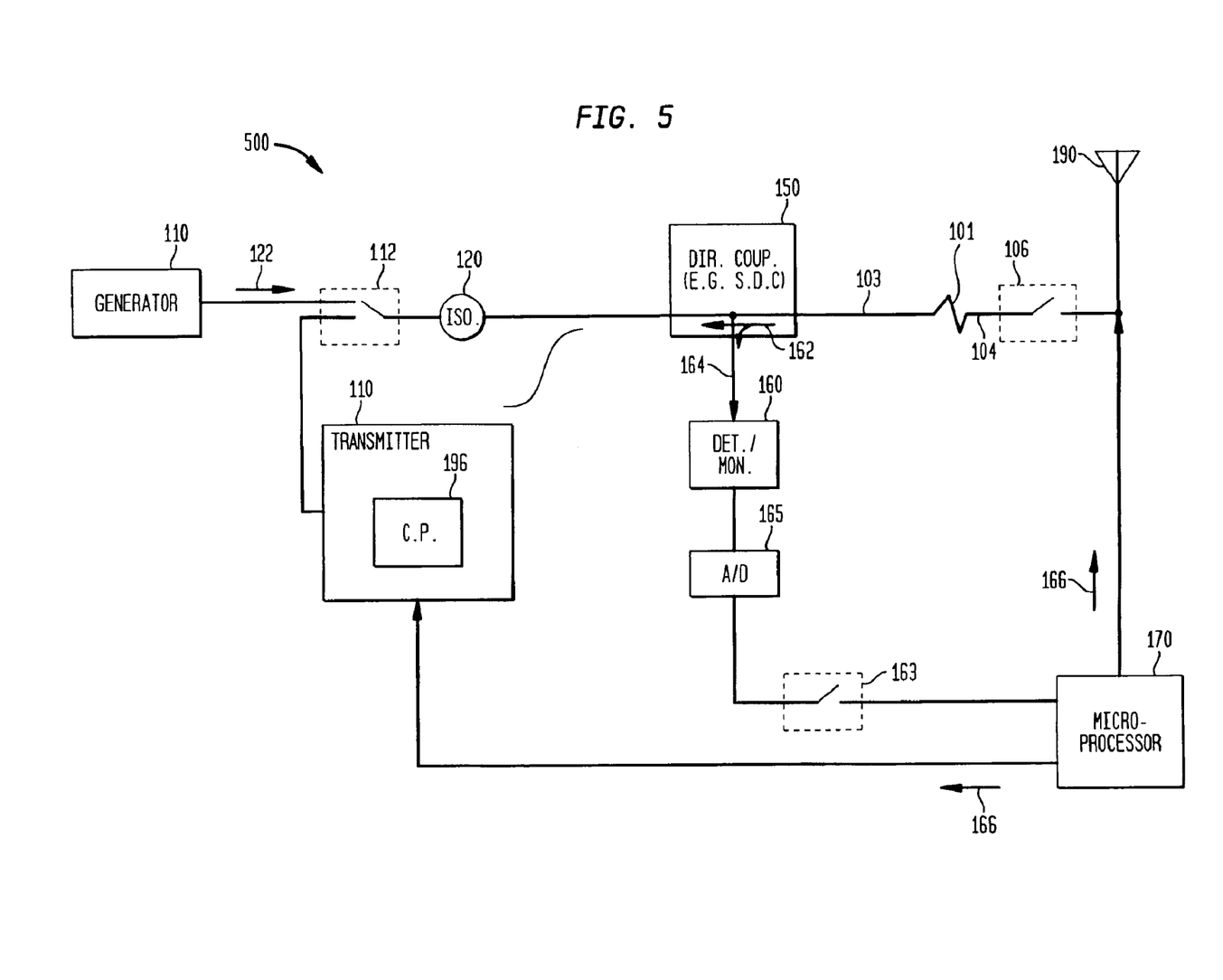
FIG. 5 provides a schematic depiction of an alternate embodiment of the invention.

In an alternative embodiment, the magnitude of the input signal energy on the cable is determined as a function of a known magnitude of the input signal itself. Thus no measurement of the input energy level is required. A circuit configuration for this embodiment is shown in FIG. 5. As will be seen in the figure, a single directional coupler 150 and its associated circuitry are used to determine the measurement of the reflected signal returning from the open or short-circuited far end of the cable. As indicated, this embodiment will require knowledge of the output power of Transmitter 110. However, such data is generally measured and recorded as part of standard factory assembly and test procedures.

Except for the fact that the measured sample of the reflected energy diverted by coupler 150 must be scaled up to the value of the full reflected energy—for comparison with the value of the full input energy—this embodiment operates in substantially the same manner as for the embodiment described above in conjunction with FIG. 2.

Figure 6:
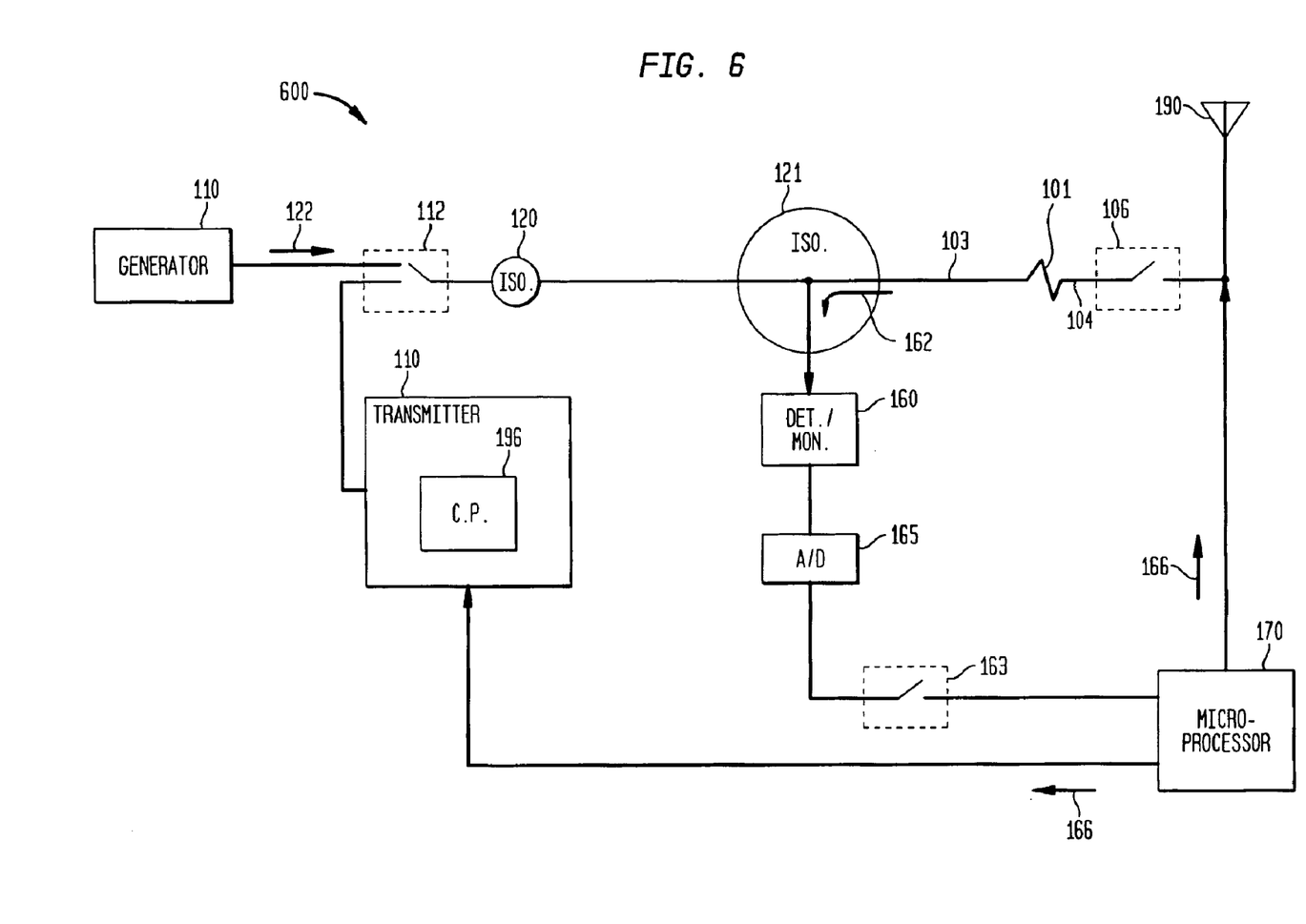
FIG. 6 provides a schematic depiction of another alternate embodiment of the invention.

Another alternative embodiment of the invention, also based on a determination of the magnitude of the input signal energy on the cable as a function of a known magnitude of the input signal, is schematically depicted in FIG. 6. This embodiment takes advantage of the fact that the reflected signal does not need to continue along the cable beyond the measurement point (and that no measurement of the input signal is required), and incorporates an isolator 121 to divert the reflected energy to a detector 160. Such an isolator has the property of causing a signal—in this case, reflected energy 162—to enter at one port, and then to exit at the closest port in a clockwise direction. The feature, as employed with respect to this embodiment of the invention, forces the reflected energy 162 to exit the isolator in the direction of the detector 160 instead of flowing on toward the signal source 110. Other than this particular feature, the alternative embodiment functions in a substantially similar manner to that of the embodiment described above in conjunction with FIG. 2. However, as should be apparent, the protective function of isolator 120 (as described in conjunction with FIG. 2) can readily be combined with the functions of isolator 121 into a single isolator unit.

As discussed above, embodiments of the invention provide methods and mechanisms for measuring transmission loss of a cable by selectively monitoring a radio frequency energy transmission sent (e.g. from the radio unit at a customer's location) over the cable to the remote end of the cable and comparing the transmission to a transmission returned from the remote end of the cable back to the point of origin of the original signal. By measuring the magnitude of the radio frequency energy sent from the originating end to the radio frequency energy reflected back to the originating end, and comparing both, it is possible to calculate the transmission loss between both ends of the cable.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for calibrating a transmission line, wherein an end of the transmission line is arranged for connection to an antenna, the method comprising the steps of:
    causing the transmission line end arranged for connection to an antenna to be disconnected from the antenna;
    feeding a signal into an input end of the transmission line for transmission of the input signal toward the antenna end of the transmission line;
    sampling the input signal to provide an energy level proportional to an energy level of the input signal;
    sampling a return signal representing a reflection of the input signal at the antenna end of the transmission line, the sampled return signal corresponding to an energy level proportional to an energy level of the return signal;
    comparing the energy level of the sampled return signal to the energy level of the sampled input signal to determine a transmission loss of the transmission line; and
    calibrating the transmission line as a function of the transmission loss.

2. The method of claim 1 wherein the step of sampling a return signal comprises the steps of:
    diverting a sample of the reflected input signal to a detection means; and
    quantifying the sample of the reflected signal.

3. The method of claim 1 wherein the step of sampling the input signal comprises the steps of:
    diverting a sample of the input signal to a detection means; and
    quantifying the sample of the input signal.

4. The method of claim 1 wherein the step of sampling a return signal comprises the further steps of:
    switching an analog/digital converter circuit from a transmitter circuit to a cable circuit;
    inputting the sampled return signal to the analog/digital converter to measure the reflected energy; and
    switching the analog/digital converter circuit back from the cable circuit to the transmitter circuit.

5. The method of claim 1 wherein the step of comparing the energy levels of the sampled return signal and the sampled input signal to determine the transmission loss comprises the steps of:
    switching a microprocessor from a transmitter circuit to a cable circuit;
    calculating the transmission loss with the microprocessor, based on the reflected energy and the input energy; and
    switching the microprocessor back from the cable circuit to the transmitter circuit.

6. A circuit for calibrating a transmission line comprising:
    a transmission line having a first and second end; and
    circuitry, connected to the transmission line, for processing radio frequency energy, wherein the circuitry is configured to:
        disable an antenna connected to the second end of the transmission line;
        feed an input signal having an energy level into the first end of the transmission line for transmission of the input energy toward the second end of the transmission line;
        sample the input signal to provide an energy level proportional to an energy level of the input signal;
        sample a return signal representing a reflection of the input signal at the second end of the transmission line, the sampled return signal corresponding to an energy level proportional to an energy level of the return signal;
        compare the energy level of the sampled return signal to the energy level of the sampled input signal to determine a transmission loss of the transmission line; and
        calibrate the transmission line as a function of the transmission loss.

7. The circuit of claim 6 further comprising:
    a directional coupler configured to sample the return signal;
    a detector configured to receive and quantify the sample of the return signal; and
    processing circuitry configured to determine a quantity of the return signal based on the sample of the return signal.

8. The circuit of claim 6 further comprising:
    a directional coupler configured to sample the input signal;
    a detector configured to receive and quantify the sample of the input signal; and
    processing circuitry configured to determine a quantity of the input signal based on the sample of the input signal.

9. The circuit of claim 6 further comprising:
    an isolator, configured to sample the return signal and to divert the sampled return signal to a detector; and
    a detector, configured to measure the sampled return signal.

10. The circuit of claim 6 wherein, to compare the energy levels of the sampled return signal the sampled input signal, the circuit is configured to:
    switch a microprocessor from a transmitter circuit to a cable circuit;

calculate the transmission loss with the microprocessor, based on the reflected energy and the input energy; and switch the microprocessor back from the cable circuit to the transmitter circuit.

11. The circuit of claim 6 further comprising a switch configured to open the connection between the second end of the cable and the antenna.

12. The circuit of claim 6 further comprising a switch configured to short the connection between the second end of the cable and the antenna.

13. The circuit of claim 6 further comprising a PIN diode configured to disable the connection between the second end of the cable and the antenna.

14. The circuit of claim 6 further comprising a relay diode configured to disable the connection between the second end of the cable and the antenna.

15. The circuit of claim 6 wherein the circuitry for processing radio frequency energy is integrated on a transmitter circuit board equipped for transmission of radio frequency energy.

16. An apparatus for calibrating a transmission line comprising:

a transmission line;

means for disabling an antenna connected to a second end of the transmission line;

means for feeding an input signal into a first end of the transmission line;

means, connected to the transmission line, for sampling the input signal to provide an energy level proportional to an energy level of the input signal means, connected to the transmission line, for sampling a return signal representing a reflection of the input signal at the second end of the transmission line, the sampled return signal corresponding to an energy level proportional to an energy level of the return signal means, connected to the transmission line, for comparing the energy level of the sampled return signal to the energy level of the sampled input signal to determine a transmission loss of the transmission line; and means for calibrating the transmission line as a function of the transmission loss.

* * * * *